US009285813B2

(12) United States Patent
Pietri et al.

(10) Patent No.: US 9,285,813 B2
(45) Date of Patent: Mar. 15, 2016

(54) SUPPLY VOLTAGE REGULATION WITH TEMPERATURE SCALING

(71) Applicant: FREESCALE SEMICONDUCTOR, INC., Austin, TX (US)

(72) Inventors: Stefano Pietri, Austin, TX (US); Juxiang Ren, Austin, TX (US); Chris C. Dao, Pflugerville, TX (US); Anis M. Jarrar, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/282,527

(22) Filed: May 20, 2014

(65) Prior Publication Data

US 2015/0338864 A1 Nov. 26, 2015

(51) Int. Cl.

*H01L 35/00* (2006.01)
*G05F 1/575* (2006.01)
*G05F 1/46* (2006.01)

(52) U.S. Cl.

CPC ................ *G05F 1/575* (2013.01); *G05F 1/463* (2013.01)

(58) Field of Classification Search

CPC ......... G05F 1/461; G05F 1/462; G05F 1/463; G05F 1/56; G05F 1/565; G05F 1/567
See application file for complete search history.

(56) References Cited

U.S. PATENT DOCUMENTS 4,298,835 A 11/1981 Rowe
5,488,288 A * 1/1996 Elmer ........................... 323/284
5,757,172 A 5/1998 Hunsdorf et al.
5,805,004 A 9/1998 Tanten et al.
8,922,178 B2 * 12/2014 Zhong et al. .................. 323/273
8,975,951 B2 * 3/2015 Inoue et al. ................... 327/513

* cited by examiner

*Primary Examiner* — Jeffrey Zweizig
(74) *Attorney, Agent, or Firm* — Gary Stanford

(57) ABSTRACT

A supply voltage regulation system for an IC including a temperature sensor that detects temperature of the IC, a scaling resistor coupled between a power grid and a feedback node of the IC, a regulator amplifier that compares a voltage of the feedback node with a reference voltage for developing a supply voltage for the IC, and a temperature scaling circuit that drives a scaling current to the scaling resistor via the feedback node to adjust the supply voltage based on temperature. The temperature scaling circuit may include one or more comparators that compare a temperature signal with corresponding temperature thresholds for selectively applying one or more bias currents to the scaling resistor. The scaling resistor may be coupled to a hot point of the power grid. A voltage difference between a hot point of a ground grid may be converted to a bias current applied to the scaling resistor.

20 Claims, 2 Drawing Sheets

150

SUPPLY VOLTAGE REGULATION WITH TEMPERATURE SCALING

BACKGROUND OF THE INVENTION

1. Field of the Invention

The present disclosure relates generally to supply voltage regulation, and more specifically to a system and method for scaling supply voltage based on temperature.

2. Description of the Related Art

The performance of an integrated circuit (IC) implemented with CMOS semiconductor device fabrication technology depends on various factors including cell delay, in which cell delay varies with temperature among other factors. Cell delay is inversely proportional to the mobility and directly proportional to the threshold voltage. Mobility and threshold voltage both decrease with an increase in temperature. A decrease in threshold voltage tends to decrease cell delay, whereas a decrease in mobility tends to increase cell delay. In this manner, cell delay is dictated by which of the two factors, mobility and threshold voltage, have the more dominant effect. If the supply voltage (the gate overdrive voltage) is much larger than the threshold voltage, to the extent that the variation of the threshold voltage due to temperature is negligible, then mobility becomes the dominant factor for cell delay change with temperature. The result is that cell delay increases with temperature. If the supply voltage is not much larger than the threshold voltage, however, then the variation of threshold voltage due to temperature has a significant effect on cell delay so that threshold voltage becomes the dominant factor.

A higher supply voltage, such as about 1.2 Volts (V), was used for semiconductor fabrication technologies above 65 nanometers (nm). A lower supply voltage, such as down to about 0.9V, may often be used when CMOS technology is scaled below 65 nm, such as 55 nm, 40 nm, 28 nm, etc., so that the effect of threshold voltage becomes more prevalent resulting in temperature inversion. In this manner, for lower supply voltages, the cell delay decreases with increased temperature. Every 10 millivolts (mV) reduction in supply voltage can have about a 2-3% performance impact due to the relative elevation of threshold voltage.

A system on a chip (SOC) design may be implemented to operate within a pre-specified optimal frequency range to balance power consumption, performance and reliability. The performance parameters are more difficult to achieve, however, at extreme temperature corners, such as −40 degrees Celsius (° C.) and +165° C. Another factor impacting performance and efficiency is the type of devices implemented on the IC, particularly those in critical timing paths. Although devices implemented with a low threshold voltage (LVT) are generally faster with higher performance, LVT devices have relatively high leakage current as compared standard threshold voltage (SVT) devices and high threshold voltage (HVT) devices. It is often desired to use less leaky devices, such as HVT and SVT, to improve leakage power while reaching a higher frequency target for a given power budget. Furthermore, the supply grids that provide power to devices distributed across the IC have a resistance that develops a voltage caused by load current. The voltage drop on the ground supply grid may also have a negative impact on performance.

BRIEF DESCRIPTION OF THE DRAWINGS

Embodiments of the present invention are illustrated by way of example and are not limited by the accompanying figures, in which like references indicate similar elements.

Elements in the figures are illustrated for simplicity and clarity and have not necessarily been drawn to scale.

DETAILED DESCRIPTION

The present inventors have recognized the need to maintain the performance of IC devices (including those incorporating SOCs and the like) across the temperature spectrum including hot and cold extreme temperature corners. The inventors have also realized the need for achieving frequency targets with less leaky devices to improve leakage power, and for reaching higher frequency targets for given frequency budgets. The inventors have also recognized the need for compensating voltage drop caused by ground grid resistance. The inventors have therefore developed a system and method of supply voltage regulation with temperature scaling that adjusts supply voltage to maintain performance within predetermined specifications across the expected temperature range. Supply voltage regulation with temperature scaling as described herein enables a reduction in the number of leaky devices used in critical timing paths on the IC by optimizing supply voltage according to operating conditions of the devices. Supply voltage regulation with temperature scaling as described herein also compensates for ground grid resistance effects.

Figure 1:
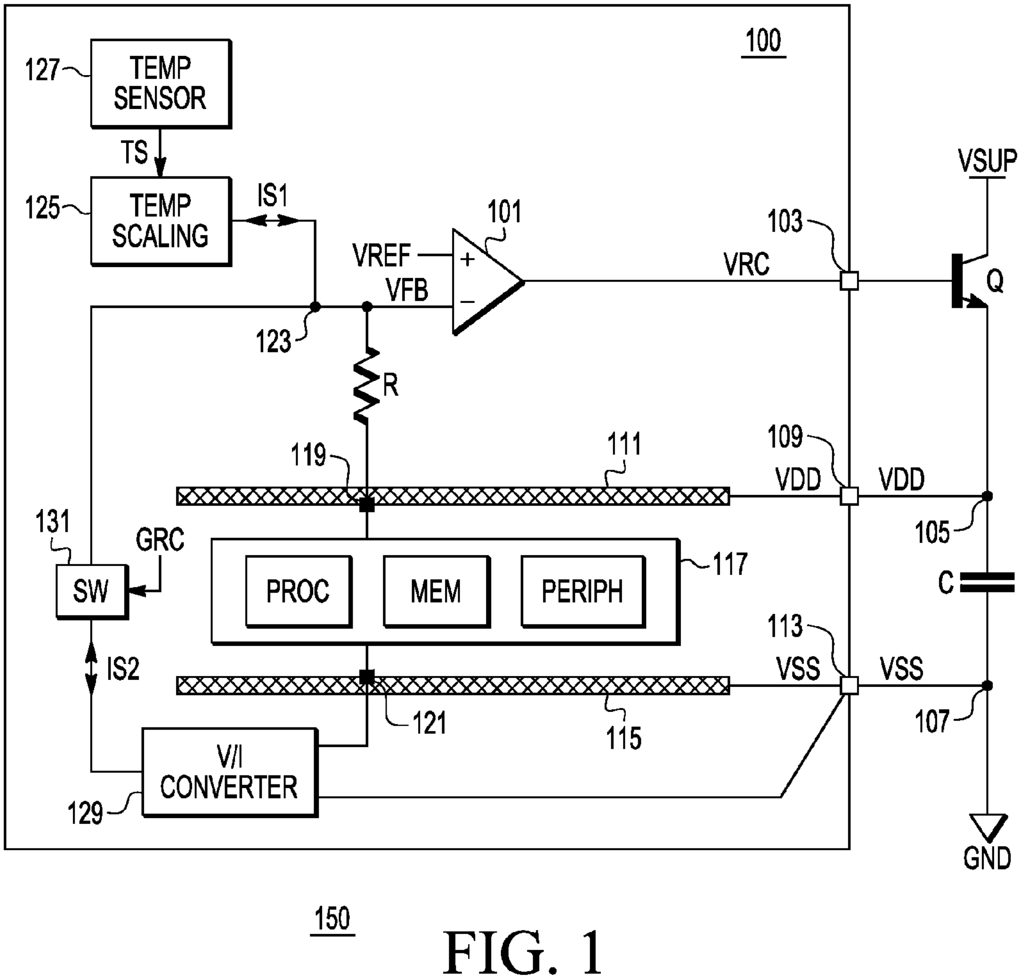
FIG. 1 is a simplified block diagram of an application system including supply voltage regulation with temperature scaling according to one embodiment.

FIG. 1 is a simplified block diagram of an application system 150 including supply voltage regulation with temperature scaling according to one embodiment. The application system 150 includes an integrated circuit (IC) 100 that may be coupled to additional external system components (not shown) mounted on a printed circuit board (PCB) or the like and designed to perform a particular application. The external system may include any number or amount of external devices, such as peripherals, power management devices, external memory, etc., to implement the functions of the end product of the particular application. In one embodiment, the IC 100 is configured as a system-on-a-chip (SOC) configuration, although alternative configurations are contemplated. Any type of consumer, commercial, or industrial application is contemplated, including, for example, computing, networking, medical, and automotive applications.

Although not shown, each IC, including the IC 100, may be implemented on a semiconductor die mounted on a corresponding package (not shown) with input/output (I/O) pads coupled to packaging pins via bond wires or the like. As shown in FIG. 1, a voltage regulator amplifier 101 is incorporated on the IC 100 and has an output providing a supply voltage control signal VRC to an I/O pad 103 of the IC 100. The pad 103 is further coupled to the base of an external power NPN bipolar junction transistor Q, having its collector coupled to a board supply voltage VSUP and its emitter coupled to an external node 105 developing a supply voltage VDD. VDD is further coupled to a VDD pad 109 of the IC 100 and to one end of a capacitor C. The other end of the capacitor C is coupled to a VSS node 107 developing a reference supply voltage VSS, which is further coupled to a VSS pad 113 of the IC 100 and to a board reference node, such as ground (GND).

The VDD pad 109 is internally coupled to a supply voltage grid 111 incorporated on the IC 100, and the VSS pad 113 is internally coupled to another supply voltage grid 115 incorporated on the IC 100, for distributing supply voltage to devices and components also integrated on the IC 100. A system load 117 is coupled between the supply voltage grids 111 and 115. Although shown coupled at one location, it is understood that the devices and components of the system load 117 are distributed across the IC 100 and conductively coupled to the supply voltage grids 111 and 115 at convenient locations. In an SOC configuration, the system load 117 may include one or more processors (PROC), a memory system (MEM), peripheral interfaces (PERIPH) and other devices coupled together via a system interface bus or the like. The system load 117 is shown coupled between a hot point 119 on the supply voltage grid 111 and another hot point 121 on the supply voltage grid 115. The hot point nodes 119 and 121 represent a location along the power supply grids carrying the highest level of system load current during normal operation. Techniques for determining supply grid hot points are well known and not further described.

A scaling resistor R is provided on the IC 100 having one end coupled to the hot point 119 of the supply voltage grid 111 and having another end coupled to a feedback node 123 developing a feedback voltage VFB. The feedback node 123 is coupled to a negative (or inverting) input of the voltage regulator amplifier 101. The voltage regulator amplifier 101 further includes a positive (or non-inverting) input receiving a reference voltage VREF. VREF may be developed on chip, but also may be provided from an external source and delivered via an I/O pad. A temperature scaling circuit 125 is included along with a temperature sensor 127. The temperature sensor 127 monitors the temperature of the semiconductor die of the IC 100 and develops a temperature sense (TS) signal indicative thereof. The TS signal is provided to an input of the temperature scaling circuit 125, which has an output coupled to the feedback node 123. The temperature scaling circuit 125 develops a temperature scaling current IS1 provided to the feedback node 123 for adjusting the voltage level of the supply voltage VDD as further described herein.

The supply voltage grids 111 and 115 each have a grid resistance measured between the external pad interface and the hot point of the corresponding supply grid. In particular, a supply grid resistance exists between the VDD pad 109 and the hot point 119 on the supply voltage grid 111. Likewise, a ground grid resistance exists between the VSS pad 113 and the hot point 121 on the supply voltage grid 115. The grid resistance of the supply voltage grid 111 is compensated by feedback operation of the voltage regulator amplifier 101. A voltage to current (V/I) converter 129 is provided on the IC 100 having a first input coupled to the VSS pad 113, a second input coupled to the hot point 121, and an output developing a second scaling current IS2 to a switch 131. The switch 131 is coupled between the output of the V/I converter 129 and the feedback node 123. The switch 131 has a control terminal receiving a ground resistance compensation (GRC) signal. The V/I converter 129 senses the ground grid resistance between VSS pad 113 and the hot point 121 and develops the scaling current IS2 indicative thereof. When the GRC signal is asserted closing the switch 131, IS2 is applied to the feedback node 123 to compensate for the ground grid resistance of the VSS supply voltage grid 115.

The V/I converter 129 is configured to sink (or source) a current level on IS2 to adjust the supply voltage VDD based on the voltage developed between the hot point 121 and the VSS pad 113 to compensate for ground grid voltage drop. During a high load level, a relatively large ground grid voltage drop develops thus effectively reducing overall supply voltage provided across the system load 117. This ground grid voltage drop is sensed by the V/I converter 129 which responsively generates a corresponding current IS2 applied through the scaling resistor R to adjust VDD by about the same voltage amount. For example, if the voltage level of the hot point 121 increases by an offset voltage level, the V/I converter 129 develops IS2 applied across R to cause the voltage regulator amplifier 101 to increase VDD by the same offset voltage.

The particular current level output of the V/I converter 129 depends on the resistance of the scaling resistor R and the expected ground grid voltage drop range. For example, if the scaling resistor R is 5 kilohms (kΩ) and the ground grid voltage level is 100 millivolts (mV) for a given load level, the V/I converter 129 may sink a current of about 20 microamperes (μA). The 20 μA current flows from VDD to VFB through R which might otherwise tend to decrease the voltage level of VFB by 100 mV. The voltage regulator amplifier 101 responsively increases the voltage level of VDD by 100 mV, so that the voltage drop between hot points 119 and 121 remains relatively unmodified. As the load level changes thus changing the ground grid voltage drop, the V/I converter 129 adjusts IS2 to adjust VDD to compensate for the ground grid voltage drop.

The reference voltage VREF is set at a level to establish a nominal voltage level for VDD for a nominal temperature level or nominal temperature range. Assuming that the temperature is within the nominal temperature range and that the scaling currents IS1 and IS2 are zero, the voltage regulator amplifier 101 drives the power transistor Q to maintain VDD at the nominal voltage level (+/− any offset voltage developed by the voltage regulator amplifier 101 and the scaling resistor R). The nominal voltage level is selected to achieve a target performance level in terms of the corresponding frequency of operation. The target performance level may be selected to balance power consumption, performance and reliability for a nominal temperature range. The temperature scaling circuit 125 operates to maintain the target performance level at any temperature.

Figure 2:
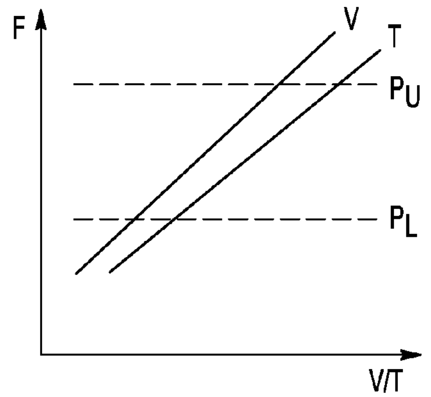
FIG. 2 is a simplified graphic diagram plotting frequency (F) versus supply voltage (V) and temperature (T) for the IC of FIG. 1.

FIG. 2 is a simplified graphic diagram plotting frequency (F) versus supply voltage (V) and temperature (T) for the IC 100. In the illustrated configuration, both supply voltage and temperature vary proportionately with the frequency of operation. In this case, the higher the temperature, the higher the frequency and vice-versa. Likewise, the higher the supply voltage, the higher the frequency and vice-versa. A pair of performance metrics $P_U$ and $P_L$ are also plotted, in which $P_U$ is an upper performance level and $P_L$ is a lower performance level. In this case, it is desired to maintain operation within the specified performance range above $P_L$ and below $P_U$.

As illustrated by FIG. 2, the temperature of the IC 100 has an effect on the frequency of operation, which in turn has an effect on the performance level. The selected technology, for example, may operate slower at decreased temperature levels thereby reducing performance. At a certain low temperature, the performance may drop below the predetermined minimum performance level $P_L$, such that the chip fails to operate properly or simply does not meet predetermined or published performance specifications. Alternatively, at a certain high temperature, the frequency may increase to a point causing malfunction, or to otherwise operate above the predetermined maximum performance level $P_U$, which violates the intended or desired balance between power consumption, performance and reliability.

The temperature scaling circuit 125 is configured to compensate for the effects of temperature by adjusting the scaling current IS1 to adjust the supply voltage VDD to maintain operation within the desired performance range. In one embodiment, for example, as the temperature increases such that the performance level otherwise increases above $P_U$, the temperature scaling circuit 125 outputs a positive IS1 current that flows through the scaling resistor R. Since the additional current IS1 tends to increase the voltage level of VFB relative to VDD, the voltage regulator amplifier 101 reacts by reducing the supply voltage of VDD. Since reduced supply voltage tends to decrease performance, the reduced supply voltage counteracts the increase of performance caused by increased temperature to maintain operation below $P_U$ and thus within specified performance levels.

In a similar manner, as the temperature decreases such that the performance level otherwise decreases below $P_L$, the temperature scaling circuit 125 outputs a negative IS1 current that draws current through the scaling resistor R from VDD to VFB. Since the additional current IS1 tends to decrease the voltage level of VFB relative to VDD, the voltage regulator amplifier 101 reacts by increasing the supply voltage of VDD. Since increased supply voltage tends to increase performance, the increased supply voltage counteracts the decrease of performance caused by decreased temperature to maintain operation above $P_L$ and thus within the specified performance levels.

It is appreciated that the plots in FIG. 2 are simplified and do not apply to all implementations. For many configurations, for example, one or both of supply voltage and temperature may vary in a non-linear manner with frequency. Also, for some configurations, the frequency/performance may be high for both temperature extremes and reduced for the intermediate or nominal temperatures resulting in a U-shaped or V-shaped curve or inverted versions thereof. Nonetheless, for any configuration, the response of the system is measured for the entire expected supply voltage and temperature range. Then, for any given temperature level, a corresponding supply voltage may be determined to ensure that the IC or system remains within the desired performance range. The temperature scaling circuit 125 is configured accordingly.

In one embodiment, the temperature scaling circuit 125 may be configured with a continuous adjustment of IS1 based on the temperature sense signal TS. In this manner, an optimal performance level may be maintained for any given temperature of operation. Such an embodiment may be suitable for some implementations, although with somewhat increased complexity and cost.

Figure 3:
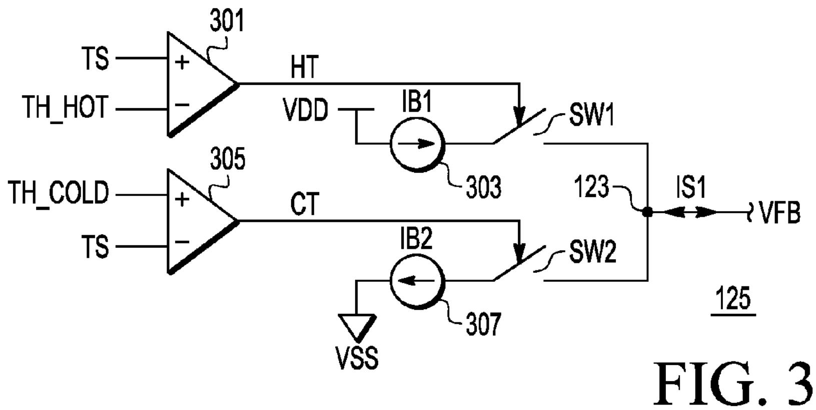
FIG. 3 is a schematic diagram of the temperature scaling circuit of FIG. 1 according to one embodiment with reduced adjustment of the supply voltage for hot and cold temperature extremes.

FIG. 3 is a schematic diagram of the temperature scaling circuit 125 according to one embodiment with reduced adjustment of the supply voltage for hot and cold temperature extremes. It is appreciated that for many configurations, a relatively wide range of operating frequencies and temperature levels may be tolerated for a given supply voltage, so that adjustment is made only for extreme temperature levels.

In the configuration of FIG. 3, a first comparator 301 compares TS received at its positive input with a hot temperature threshold voltage level TH_HOT received at its negative input for providing a high temperature sense signal HT at its output. HT is provided to the control terminal of a first normally-open, single-pole, single throw (SPST) switch SW1, having a first controlled terminal coupled to one terminal of a current source 303 and a second controlled terminal coupled to the feedback node 123. The other terminal of the current source 303 is coupled to VDD (or any other suitable supply voltage, e.g., VSUP), and the current source 303 sources a bias current IB1 to node 123 when the switch SW1 is closed. Also, a second comparator 305 compares TS received at its negative input with a cold temperature threshold voltage level TH_COLD received at its positive input for providing a cold temperature sense signal CT at its output. CT is provided to the control terminal of a second normally-open, SPST switch SW2, having a first controlled terminal coupled to one terminal of a current source 307 and a second controlled terminal coupled to the feedback node 123. The other terminal of the current source 307 is coupled to VSS, and the current source 307 sinks a bias current IB2 from node 123 when the switch SW2 is closed.

Figure 4:
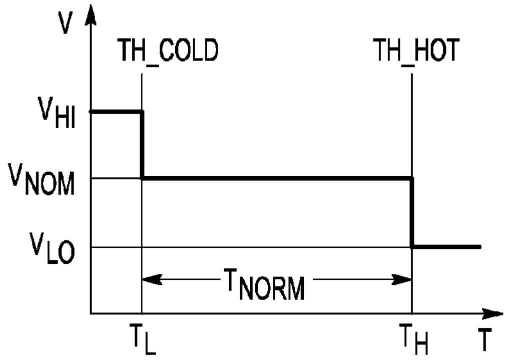
FIG. 4 is a simplified graph diagram illustrating operation of the temperature scaling circuit of FIG. 3, in which supply voltage V is plotted versus temperature T.

FIG. 4 is a simplified graph diagram illustrating operation of the temperature scaling circuit 125 of FIG. 3, in which supply voltage V is plotted versus temperature T. When the temperature is within the "normal" operating range $T_{NORM}$ range below a predetermined hot temperature threshold level $T_H$ corresponding to TH_HOT and above a predetermined cold temperature threshold level $T_L$ corresponding to TH_COLD, both comparators 301 and 305 pull the HT and CT signals low opening both switches SW1 and SW2 so that IS1 is zero. In this case, VDD is set by VREF at a nominal voltage level $V_{NOM}$ (which may be further adjusted by any ground level adjustment made by IS2 if GRC is asserted closing switch 131). If and when the temperature rises above a predetermined hot temperature threshold level $T_H$ so that TS rises above TH_HOT, the comparator 301 switches asserting HT and closing switch SW1 so that bias current IB1 is applied to the feedback node 123. The additional bias current IB1 is applied to the scaling resistor R causing the voltage regulator amplifier 101 to reduce the voltage level of VDD to a low voltage level $V_{LO}$. Thus, when the temperature rises to the level such that the performance level would otherwise increase above a predetermined high level (e.g., as indicated by $P_U$ of FIG. 2), the supply voltage VDD is reduced to counteract the effect of temperature and to keep the performance level within predetermined levels.

Alternatively, if and when the temperature falls below a predetermined cold temperature threshold level $T_L$ so that TS falls below TH_COLD, the comparator 305 switches asserting CT and closing switch SW2 so that bias current IB2 is pulled from the feedback node 123. The bias current IB2 drawn through the scaling resistor R causes the voltage regulator amplifier 101 to increase the voltage level of VDD to a high voltage level $V_{HI}$. Thus, when the temperature falls to the level such that the performance level would otherwise decrease below a predetermined low level (e.g., as indicated by $P_L$ of FIG. 2), the supply voltage VDD is increased to counteract the effect of temperature and to keep the performance level within predetermined levels.

The embodiment of the temperature scaling circuit 125 shown in FIG. 3 provides sufficient adjustment for many configurations with a relatively wide performance operating range achieved with a corresponding large number of temperature and supply voltage values. If the response to supply voltage and/or temperature is more diverse and/or if the performance range is reduced for a given configuration, additional comparators and current devices may be included for additional adjustments. The temperature scaling circuit 125 may be implemented with any suitable number of comparators and corresponding current devices to implement as many adjustments to the supply voltage as necessary for any discrete number of temperature levels.

The specific resistance of the scaling resistor R and the current levels of IB1 and IB2 depend upon the particular implementation. In one embodiment, for example, R may be on the order or 1-10 kΩ with bias current levels on the order of 1-50 μA for feedback voltage level adjustments on the order of 1-500 mV. It is understood, however, that any other suitable resistance values and current levels may be used for particular implementations. Also, any one or more of the current devices may be reversed for configurations in which temperature and/or voltage has the opposite effect on performance, such as for older or larger CMOS technologies.

Figure 5:
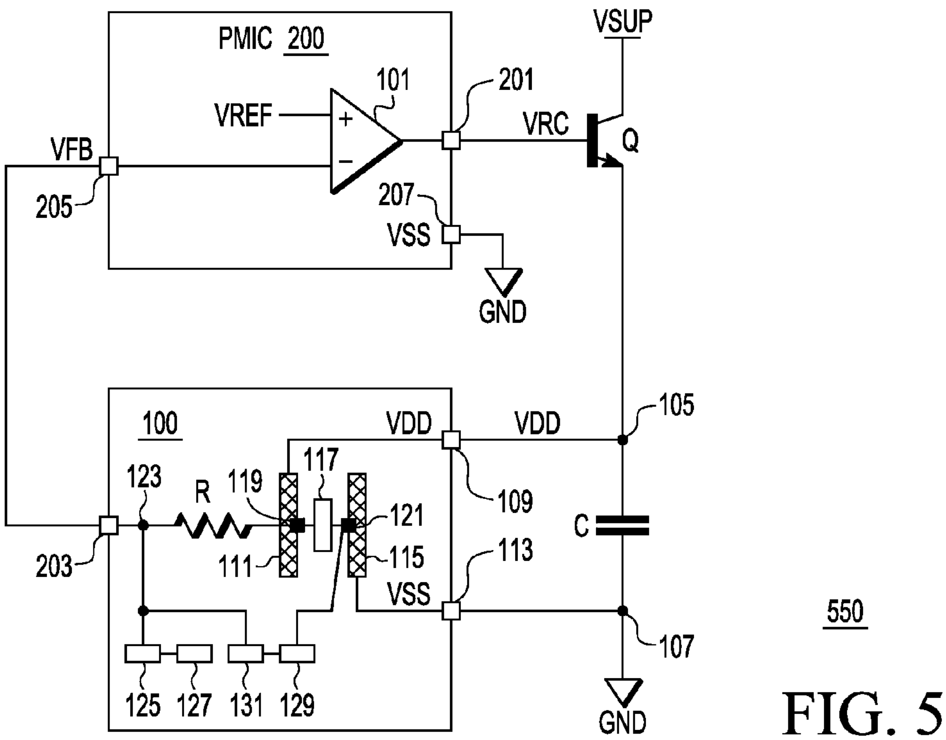
FIG. 5 is a simplified block diagram of an application system including a supply voltage regulation with temperature scaling according to another embodiment with an external voltage regulator amplifier.

FIG. 5 is a simplified block diagram of an application system 550 including a supply voltage regulation with temperature scaling according to another embodiment. The application system 550 is substantially similar to the application system 150 and also includes the IC 100 configured in substantially similar manner. In this case, the voltage regulator amplifier 101 is not incorporated on the IC 100 but instead is incorporated on a separate power management IC (PMIC) 200. The IC 100 includes the scaling resistor R in similar manner, except that the feedback node 123 is externally coupled via an I/O feedback pad 203. The PMIC 200 includes a feedback pad 205 coupled to the feedback pad 203 of the IC 100, in which the feedback voltage VFB is provided to the negative input of the voltage regulator amplifier 101 within the PMIC 200. VREF is provided in similar manner to the positive input of the voltage regulator amplifier 101, which develops the VRC supply voltage control signal provided on a supply pad 201 of the PMIC 200. Pad 201 is externally coupled to the base of Q, coupled in similar manner with its collector coupled to VSUP and its emitter coupled to node 105 developing supply voltage VDD which is further coupled to one end of the capacitor C. The PMIC 200 includes a VSS pad 207 externally coupled to GND. The VDD pad 109 of the IC 100 is coupled to node 105, and the VSS pad 113 of the IC 100 is also coupled to node 107 which is coupled to GND. In this manner, the IC 100 includes the feedback pad 203 rather than the I/O pad 103, but is otherwise configured in substantially the same manner as shown in FIG. 1. Operation of the application system 550 is substantially the same as that described for the application system 150.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms “a” or “an,” as used herein, are defined as one or more than one. Also, the use of introductory phrases such as “at least one” and “one or more” in the claims should not be construed to imply that the introduction of another claim element by the indefinite articles “a” or “an” limits any particular claim containing such introduced claim element to inventions containing only one such element, even when the same claim includes the introductory phrases “one or more” or “at least one” and indefinite articles such as “a” or “an.” The same holds true for the use of definite articles. Unless stated otherwise, terms such as “first” and “second” are used to arbitrarily distinguish between the elements such terms describe. Thus, these terms are not necessarily intended to indicate temporal or other prioritization of such elements.

The invention claimed is:

1. A supply voltage regulation system, comprising:

an integrated circuit having a ground pad coupled to a ground grid incorporated on said integrated circuit and a having a power pad coupled to a power grid incorporated on said integrated circuit;

a temperature sensor provided on said integrated circuit that provides a temperature sense signal indicative of a die temperature of said integrated circuit;

a scaling resistor having a first end coupled to said power grid and having a second end coupled to a feedback node;

a voltage to current converter having a first input coupled to said ground pad, having a second input coupled to a hot point of said ground grid, and having an output for coupling to said feedback node;

a voltage regulator amplifier having a first input receiving a reference voltage, having a second input coupled to said feedback node, and having an output for driving a supply voltage to said power pad of said integrated circuit; and a temperature scaling circuit having an input receiving said temperature sense signal and having an output coupled to said feedback node, wherein said temperature scaling circuit drives a scaling current to said scaling resistor via said feedback node to adjust said supply voltage based on said temperature sense signal.

2. The supply voltage regulation system of claim 1, wherein said voltage regulator amplifier is incorporated on said integrated circuit.

3. The supply voltage regulation system of claim 1, wherein said first end of said scaling resistor is coupled to a hot point of said power grid.

4. The supply voltage regulation system of claim 1, wherein said temperature scaling circuit comprises:

a current source having an output providing a bias current;

a switch having a first current terminal coupled to an output of said current source, having a second current terminal coupled to said feedback node, and having a control input; and a comparator having a first input receiving said temperature sense signal having a second input receiving a temperature threshold, and having an output coupled to a control input of said switch.

5. The supply voltage regulation system of claim 1, wherein said temperature scaling circuit comprises:

a plurality of current sources, each having an output providing a corresponding one of a plurality of bias currents;

a plurality of switches, each having a first current terminal coupled to an output of a corresponding one of said plurality of current sources, each having a second current terminal coupled to said feedback node, and each having a control input; and a plurality of comparators, each having a first input receiving said temperature sense signal, each having a second input receiving a corresponding one of a plurality of temperature thresholds, and each having an output coupled to a control input of a corresponding one of said plurality of switches.

6. The supply voltage regulation system of claim 5, wherein each of said plurality of comparators is configured to activate a corresponding one of said plurality of switches to apply a corresponding one of said plurality of bias currents to said scaling resistor via said feedback node when a corresponding temperature condition is met based on a comparison of said temperature sense signal and a corresponding one of said plurality of temperature thresholds.

7. The supply voltage regulation system of claim 1, wherein said temperature scaling circuit comprises:

a first current source having an output providing a first bias current;

a first switch having current terminals coupled between said output of said first current source and said feedback node, and having a control input;

a second current source having an output providing a second bias current;

a second switch having current terminals coupled between said output of said second current source and said feedback node, and having a control input;

a first comparator having a first input receiving said temperature sense signal, having a second input receiving a first temperature threshold, and having an output coupled to said control input of said first switch; and a second comparator having a first input receiving said temperature sense signal, having a second input receiving a second temperature threshold, and having an output coupled to said control input of said second switch.

8. The supply voltage regulation system of claim 7, wherein said first comparator is configured to activate said first switch to apply said first bias current to said scaling resistor via said feedback node when temperature rises above a first predetermined temperature level indicated by said first temperature threshold, and wherein said second comparator is configured to activate said second switch to apply said second bias current to said scaling resistor via said feedback node when temperature falls below a second predetermined temperature level indicated by said second temperature threshold.

9. The supply voltage regulation system of claim 8, wherein said first bias current causes said voltage regulator amplifier to decrease said supply voltage when applied to said feedback node, and wherein said second bias current causes said voltage regulator amplifier to increase said supply voltage when applied to said feedback node.

10. The supply voltage regulation system of claim 1, further comprising a switch that selectively couples said output of said voltage to current converter to said feedback node.

11. The supply voltage regulation system of claim 1, further comprising a processor and memory coupled between said power grid and said ground grid.

12. A method of regulating a supply voltage of an integrated circuit based on temperature, comprising:

coupling a scaling resistor between a feedback node and a power grid of the integrated circuit;

comparing a voltage of the feedback node with a reference voltage and providing a control voltage;

developing the supply voltage based on the control voltage and providing the supply voltage to the power grid;

sensing a temperature of the integrated circuit;

providing a bias current based on the temperature to the scaling resistor via the feedback node;

converting a voltage between a hot point of a ground grid of the integrated circuit and a ground input of the integrated circuit to a bias current; and applying the bias current to the scaling resistor via the feedback node.

13. The method of claim 12, wherein said coupling a scaling resistor comprises coupling the scaling resistor to a hot point of the power grid.

14. The method of claim 12, wherein said developing a supply voltage comprises driving a transistor with the control voltage.

15. The method of claim 12, wherein said providing a bias current comprises:

comparing the temperature with a predetermined temperature threshold; and applying the bias current to the feedback node when the temperature reaches the predetermined temperature threshold.

16. The method of claim 15, wherein said applying the bias current to the feedback node comprises increasing a voltage level of the supply voltage.

17. The method of claim 15, wherein said applying the bias current to the feedback node comprises decreasing a voltage level of the supply voltage.

18. The method of claim 12, wherein said providing a bias current comprises:

comparing temperature with a predetermined plurality of temperature thresholds; and applying a corresponding one of a plurality of bias currents to the feedback node when the temperature reaches a corresponding one of the predetermined plurality of temperature thresholds.

19. A supply voltage regulation system, comprising:

an integrated circuit having a ground pad coupled to a ground grid incorporated on said integrated circuit and a having a power pad coupled to a power grid incorporated on said integrated circuit;

a temperature sensor provided on said integrated circuit that provides a temperature sense signal indicative of a die temperature of said integrated circuit;

a scaling resistor having a first end coupled to said power grid and having a second end coupled to a feedback node;

a voltage regulator amplifier having a first input receiving a reference voltage, having a second input coupled to said feedback node, and having an output for driving a supply voltage to said power pad of said integrated circuit; and a temperature scaling circuit having an input receiving said temperature sense signal and having an output coupled to said feedback node, wherein said temperature scaling circuit drives a scaling current to said scaling resistor via said feedback node to adjust said supply voltage based on said temperature sense signal, wherein said temperature scaling circuit comprises:

a current source having an output providing a bias current;

a switch having a first current terminal coupled to an output of said current source, having a second current terminal coupled to said feedback node, and having a control input; and a comparator having a first input receiving said temperature sense signal having a second input receiving a temperature threshold, and having an output coupled to a control input of said switch.

20. A method of regulating a supply voltage of an integrated circuit based on temperature, comprising:

coupling a scaling resistor between a feedback node and a power grid of the integrated circuit;

comparing a voltage of the feedback node with a reference voltage and providing a control voltage;

developing the supply voltage based on the control voltage and providing the supply voltage to the power grid;

sensing a temperature of the integrated circuit; and providing a bias current based on the temperature to the scaling resistor via the feedback node, comprising:

comparing the temperature with a predetermined temperature threshold; and applying the bias current to the feedback node when the temperature reaches the predetermined temperature threshold.

* * * * *